United States Patent
Chan et al.

(10) Patent No.: US 12,136,544 B2
(45) Date of Patent: Nov. 5, 2024

(54) ETCH UNIFORMITY IMPROVEMENT FOR SINGLE TURN INTERNAL COIL PVD CHAMBER

(71) Applicant: Applied Materials, Inc., Santa Clara, CA (US)

(72) Inventors: Anthony Chih-Tung Chan, Sunnyvale, CA (US); Adolph Miller Allen, Oakland, CA (US); Mehul Chauhan, Santa Clara, CA (US); Goichi Yoshidome, Albany, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/865,144

(22) Filed: Jul. 14, 2022

(65) Prior Publication Data

US 2023/0141298 A1     May 11, 2023

Related U.S. Application Data

(60) Provisional application No. 63/276,493, filed on Nov. 5, 2021.

(51) Int. Cl.
*H01J 37/34*      (2006.01)
*C23C 14/35*      (2006.01)

(52) U.S. Cl.
CPC .......... *H01J 37/3452* (2013.01); *C23C 14/35* (2013.01); *H01J 37/3417* (2013.01); *H01J 2237/3323* (2013.01)

(58) Field of Classification Search
CPC ..... C23C 14/35; C23C 14/351; C23C 14/358; H01J 37/3452; H01J 37/3417; H01J 37/321; H01J 37/3211; H01J 37/3266; H01J 2237/3323

USPC ........... 204/298.06, 298.09, 298.12, 298.16, 204/298.19, 298.21, 298.22
See application file for complete search history.

(56) References Cited

U.S. PATENT DOCUMENTS

| | | | |
|---|---|---|---|
| 4,990,229 A * | 2/1991 | Campbell | ............ H01J 37/3211 204/298.37 |
| 5,876,574 A | 3/1999 | Hofmann et al. | |
| 6,224,724 B1 * | 5/2001 | Licata | ................... H01J 37/321 257/E21.17 |
| 6,231,725 B1 | 5/2001 | Nulman et al. | |
| 6,610,184 B2 | 8/2003 | Ding et al. | |
| 8,696,875 B2 | 4/2014 | Ding et al. | |
| 8,920,613 B2 | 12/2014 | Boitnott et al. | |

(Continued)

FOREIGN PATENT DOCUMENTS

JP      2006-307243 A      11/2006

*Primary Examiner* — Rodney G McDonald
(74) *Attorney, Agent, or Firm* — MOSER TABOADA

(57) ABSTRACT

Methods and apparatus for generating a magnetic field external to a physical vapor deposition (PVD) chamber to improve etch or deposition uniformity on a substrate disposed inside of the PVD chamber are provided herein. In some embodiments, a process chamber, includes a chamber body defining an interior volume therein; a pedestal disposed in the interior volume for supporting a substrate; a coil disposed in the interior volume above the pedestal; and an external magnet assembly, comprising: a housing coupled to the chamber body; and a plurality of magnets disposed external to the chamber body coupled to the housing and arranged asymmetrically about the chamber body.

20 Claims, 5 Drawing Sheets

(56) References Cited

U.S. PATENT DOCUMENTS

| | | |
|---|---|---|
| 9,928,997 B2 | 3/2018 | Miller et al. |
| 11,062,939 B2 | 7/2021 | Gottheim et al. |
| 2006/0207873 A1* | 9/2006 | Fu .................... H01J 37/3408 |
| | | 204/192.1 |
| 2022/0033956 A1 | 2/2022 | Gunther et al. |

* cited by examiner

ETCH UNIFORMITY IMPROVEMENT FOR SINGLE TURN INTERNAL COIL PVD CHAMBER

CROSS-REFERENCE TO RELATED APPLICATIONS

This application claims benefit of U.S. provisional patent application Ser. No. 63/276,493, filed Nov. 5, 2021, which is herein incorporated by reference in its entirety.

FIELD

Embodiments of the present disclosure generally relate to substrate processing equipment.

BACKGROUND

The manufacture of the sub-half micron and smaller features in the semiconductor industry rely upon a variety of processing equipment, such as process chambers, for example, physical vapor deposition (PVD) chambers, chemical vapor deposition (CVD) chambers, atomic layer deposition (ALD) chambers, and the like. The process chambers may use coils disposed between a target and a substrate support of the process chamber to maintain a plasma in the process chamber. However, the inventors have observed PVD chambers having a single turn internal coil may lead to asymmetrical material etch on a substrate being processed in the process chamber when operating at low bias power and high pressure 10 mTorr).

Therefore, the inventors have provided improved PVD process chambers to help improve process uniformity.

SUMMARY

Methods and apparatus for generating a magnetic field external to a physical vapor deposition (PVD) chamber to improve etch or deposition uniformity on a substrate disposed inside of the PVD chamber are provided herein. In some embodiments, a process chamber, includes a chamber body defining an interior volume therein; a pedestal disposed in the interior volume for supporting a substrate; a coil disposed in the interior volume above the pedestal; and an external magnet assembly, comprising: a housing coupled to the chamber body; and a plurality of magnets disposed external to the chamber body coupled to the housing and arranged asymmetrically about the chamber body.

In some embodiments, an external magnet assembly for use with a process chamber includes: a housing having a plate and an inner lip extending upward from the plate to define a central opening of the housing; a plurality of arcuate base plates coupled to the housing; and a plurality of magnets coupled to each of the plurality of arcuate base plates.

In some embodiments, a process chamber includes: a chamber body coupled to a lid to define an interior volume therein; a pedestal disposed in the interior volume for supporting a substrate; a coil disposed in the interior volume above the pedestal; and an external magnet assembly, comprising: a housing coupled to the chamber body, two arcuate base plates coupled to the housing; and a plurality of magnets disposed external to the chamber body coupled to the housing via the two arcuate base plates and arranged asymmetrically about the chamber body, wherein the plurality of magnets are arranged in a plurality of magnet sets.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1A:
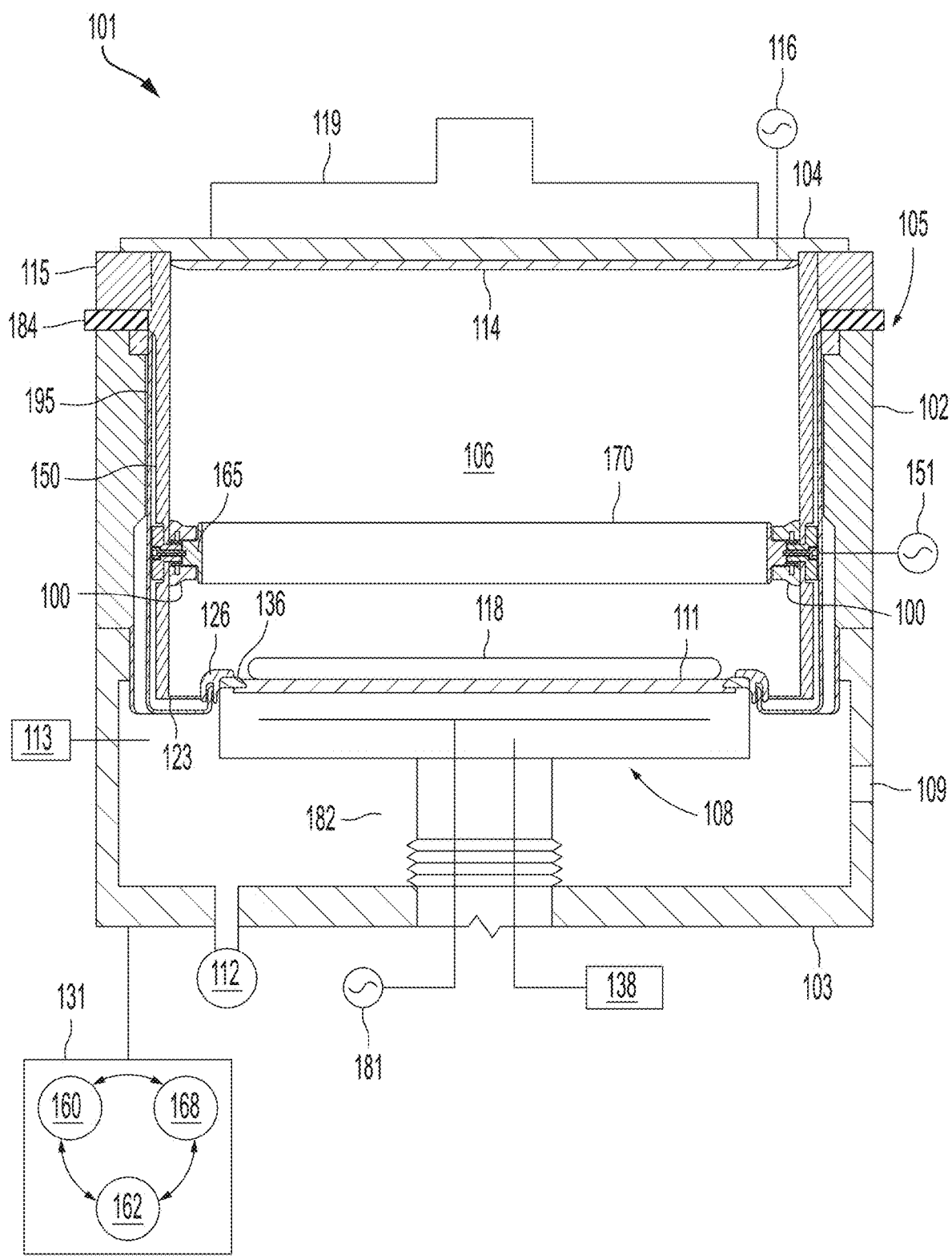
FIG. 1A depicts a schematic cross-sectional view of a process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for generating a magnetic field external to a physical vapor deposition (PVD) chamber to improve etch uniformity of a substrate disposed inside of the PVD chamber are provided herein. One or more external magnets may be disposed about the PVD chamber to advantageously improve plasma density near the external magnets inside of the PVD chamber during operation.

The PVD may use coils disposed between a target and a substrate support of the process chamber to maintain a plasma in the process chamber. The amount of capacitive coupling from the coil to the plasma and the discrete termination impedance, or capacitance, to the coil, affects the uniformity of plasma across the chamber. Finite capacitive coupling from the coil reduces the conduction current along the path of the coil, thereby reducing the magnitude of the local inductive electric field and affecting the ion distribution. The effect on the ion distribution leads to asymmetries, or non-uniformity, of etch rates on a substrate being processed. The inventors have observed that the asymmetries are correlated with azimuthal variations in input and pumping of gases, circuit issues related to transmission line matching to the coil, and particulars of the reactor configuration. The one or more external magnets may advantageously be disposed vertically above the coils of the PVD chamber and proximate the target of the PVD chamber. In some embodiments, the external magnet assembly is disposed vertically between the coil and the target. The one or more external magnets are generally disposed radially outward of the target.

FIG. 1A depicts a schematic cross-sectional view of a process chamber 101 in accordance with at least some embodiments of the present disclosure. The process chamber 101 may be a PVD chamber or any other suitable deposition or etch chamber. The process chamber 101 has a chamber body 105 that includes sidewalls 102 and a bottom 103. A lid 104 is disposed on the chamber body 105 to define an interior volume 106 therein. A substrate support having a pedestal 108 is disposed in the interior volume 106 of the process chamber 101. A substrate transfer port 109 is formed in the sidewalls 102 for transferring substrates into and out of the interior volume 106.

An adapter 115 may be disposed between the chamber body 105 and the lid 104. An external magnet assembly 184 having one or more external magnets (e.g., the one or more magnets 210) may be disposed between the sidewalls 102 and the lid 104 or the sidewalls 102 and the adapter 115. The lid 104 may support a sputtering source, such as a target 114. The target 114 generally provides a source of material which will be deposited in the substrate 118. The target 114 consists essentially of a metal, such as titanium (Ti), tantalum (Ta), tungsten (W), cobalt (Co), nickel (Ni), copper (Cu), aluminum (Al), ruthenium (Ru), niobium (Nb), alloys thereof, combinations thereof, or the like. In some embodiments, the target 114 is at least about 99.9% of a metal, such as titanium (Ti), tantalum (Ta), tungsten (W), cobalt (Co), nickel (Ni), copper (Cu), aluminum (Al), ruthenium (Ru), or niobium (Nb).

The target 114 may be coupled to a DC source power assembly 116. A magnetron 119 may be coupled adjacent to the target 114. Examples of the magnetron 119 assembly include an electromagnetic linear magnetron, a serpentine magnetron, a spiral magnetron, a double-digitated magnetron, a rectangularized spiral magnetron, or the like. Alternately, powerful magnets may be placed adjacent to the target 114. The magnets may be rare earth magnets such as neodymium or other suitable materials for creating a strong magnetic field. The magnetron 119 may be configured to confine the plasma as well as distribute the concentration of plasma along the target 114.

A gas source 113 is coupled to the process chamber 101 to supply process gases into the interior volume 106. In some embodiments, process gases may include one or more inert gases or reactive gases. Examples of process gases that may be provided by the gas source 113 include, but not limited to, argon (Ar), helium (He), neon (Ne), nitrogen ($N_2$), oxygen ($O_2$), chlorine (Cl), water vapor ($H_2O$), or the like.

A pumping device 112 is coupled to the process chamber 101 in communication with the interior volume 106 to control the pressure of the interior volume 106. In some embodiments, the pressure of the process chamber 101 may be maintained at about 1 Torr or less. In some embodiments, the pressure within the process chamber 101 may be maintained at about 500 millitorr or less. In other embodiments, the pressure within the process chamber 101 may be maintained between about 1 millitorr and about 300 millitorr.

In some embodiments, a controller 131 is coupled to the process chamber 101. The controller 131 includes a central processing unit (CPU) 160, a memory 168, and support circuits 162. The controller 131 is utilized to control the process sequence, regulating the gas flows from the gas source 113 into the process chamber 101 and controlling ion bombardment of the target 114. The CPU 160 may be of any form of a general-purpose computer processor that can be used in an industrial setting. The software routines can be stored in the memory 168, such as random-access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU 160 into a computer (controller 131) that controls the process chamber 101 such that the processes are performed in accordance with the present disclosure. The software routines may also be stored and/or executed by a second controller (not shown) that is located remotely from the process chamber 101.

An additional RF power source 181 may also be coupled to the process chamber 101 through the pedestal 108 to provide a bias power between the target 114 and the pedestal 108, as needed. In some embodiments, the RF power source 181 may provide power to the pedestal 108 to bias the substrate 118 at a frequency between about 1 MHz and about 100 MHz, such as about 13.56 MHz.

The pedestal 108 may be moveable between a raised position and a lowered position, as shown by arrow 182. In the lowered position, a top surface 111 of the pedestal 108 may be aligned with or just below the substrate transfer port 109 to facilitate entry and removal of the substrate 118 from the process chamber 101. The top surface 111 may have an edge deposition ring 136 sized to receive the substrate 118 thereon while protecting the pedestal 108 from plasma and deposited material. The pedestal 108 may be moved to the raised position closer to the target 114 for processing the substrate 118 in the process chamber 101. A cover ring 126 may engage the edge deposition ring 136 when the pedestal 108 is in the raised position. The cover ring 126 may prevent deposition material from bridging between the substrate 118 and the pedestal 108. When the pedestal 108 is in the lowered position, the cover ring 126 is suspended above the pedestal 108 and substrate 118 positioned thereon to allow for substrate transfer.

During substrate transfer, a robot blade (not shown) having the substrate 118 thereon is extended through the substrate transfer port 109. Lift pins (not shown) extend through the top surface 111 of the pedestal 108 to lift the substrate 118 from the top surface 111 of the pedestal 108, thus allowing space for the robot blade to pass between the substrate 118 and pedestal 108. The robot may then carry the substrate 118 out of the process chamber 101 through the substrate transfer port 109. Raising and lowering of the pedestal 108 and/or the lift pins may be controlled by the controller 131.

During sputter deposition, the temperature of the substrate 118 may be controlled by utilizing a thermal controller 138 disposed in the pedestal 108. The substrate 118 may be heated to a desired temperature for processing. After processing, the substrate 118 may be rapidly cooled utilizing the thermal controller 138 disposed in the pedestal 108. The thermal controller 138 controls the temperature of the substrate 118 and may be utilized to change the temperature of the substrate 118 from a first temperature to a second temperature in a matter of seconds to about a minute.

An inner shield 150 may be positioned in the interior volume 106 between the target 114 and the pedestal 108. The inner shield 150 may be formed of aluminum or stainless steel among other materials. In some embodiments, the inner shield 150 is formed from stainless steel. An outer shield 195 may be formed between the inner shield 150 and the sidewall 102. The outer shield 195 may be formed from aluminum or stainless steel among other materials. The outer shield 195 may extend past the inner shield 150 and is configured to support the cover ring 126 when the pedestal 108 is in the lowered position.

In some embodiments, the inner shield 150 includes a radial flange 123 that includes an inner diameter that is greater than an outer diameter of the inner shield 150. The radial flange 123 extends from the inner shield 150 at an angle of about ninety degrees or greater relative to the inside diameter surface of the inner shield 150. The radial flange 123 may be a circular ridge extending from the surface of the inner shield 150 and is generally adapted to mate with a recess formed in the cover ring 126 disposed on the pedestal 108. The recess may be a circular groove formed in the cover ring 126 which centers the cover ring 126 with respect to the longitudinal axis of the pedestal 108.

The process chamber 101 has a coil 170 disposed in the interior volume 106 between the target 114 and the pedestal 108. The coil 170 of the process chamber 101 may be just inside the inner shield 150 and positioned above the pedestal 108. In some embodiments, the coil 170 is positioned nearer to the pedestal 108 than the target 114. The coil 170 may be formed from a material similar in composition to the target 114, for example, any of the materials discussed above to act as a secondary sputtering target. The coil 170 may be a single turn coil.

Figure 1B:
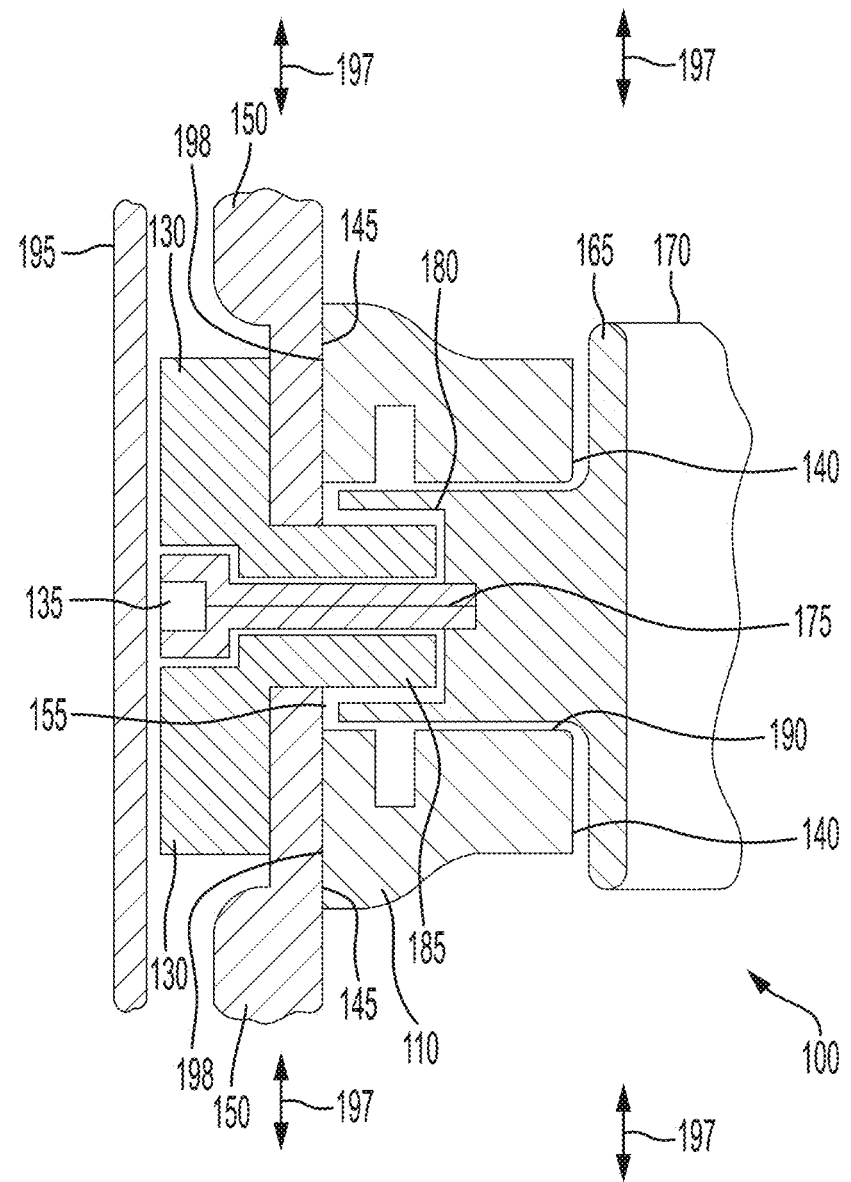
FIG. 1B depicts a close-up cross-sectional view of an interface between a coil and the inner shield in accordance with at least some embodiments of the present disclosure.

In some embodiments, the coil 170 is supported from the inner shield 150 by a plurality of chamber components, such as chamber component 100, which may comprise or consist of coil spacers 110 (see FIG. 1B). The coil spacers 110 may electrically isolate the coil 170 from the inner shield 150 and other chamber components. The coil 170 may be coupled to a power source 151. The power source 151 may be an RF power source, a DC power source, or both an RF power source and a DC power source. The power source 151 may have electrical leads which penetrate the sidewall 102 of the process chamber 101, the outer shield 195, the inner shield 150 and the coil spacers 110. The coil 170 includes a plurality of hubs 165 for providing power to the coil 170 and couple the coil 170 to the inner shield 150, or another chamber component. The electrical leads connect to one or more hubs of the plurality of hubs 165 on the coil 170 for providing power to the coil 170. One or more of the plurality of hubs 165 may have a plurality of insulated electrical connections for providing power to the coil 170. Additionally, the plurality of hubs 165 may be configured to interface with the coil spacers 110 and support the coil 170. In some embodiments, the power source 151 applies current to the coil 170 to induce an RF field within the process chamber 101 and couple power to the plasma for increasing the plasma density, i.e., concentration of reactive ions.

FIG. 1B depicts a close-up cross-sectional view of an interface between a coil 170 and the inner shield 150 in accordance with at least some embodiments of the present disclosure. The chamber component 100 may include a coil spacer 110. In some embodiments, the chamber component 100 includes only a coil spacer 110. The chamber component 100 may optionally include at least one hub receptor 130. A fastener 135 may be utilized to hold the hub receptor 130 and coil spacer 110 together to form the chamber component 100. For example, the fastener 135 may extend through the hub receptor 130 and into one of the plurality of hubs 165. In some embodiments, the fastener 135 may include a central channel 175 extending through the fastener 135 along an elongate axis of the fastener 135 to prevent air pockets between the fastener 135 and plurality of hubs 165.

The coil spacer 110 has a top portion 140 and a bottom portion 145. The bottom portion 145 may be disposed proximate the inner shield 150. The coil spacer 110, the hub receptor 130, and the fastener 135 may attach together to secure the coil spacer 110 to the inner shield 150. In some embodiments, the bottom portion 145 of the coil spacer 110 is disposed proximate an opening 155 between the coil 170 and the inner shield 150. The coil spacer 110 may facilitate maintaining the opening 155 between the coil 170 and the inner shield 150 to electrically isolate the coil 170 from the inner shield 150. In some embodiments, the inner shield 150 may have a feature (not shown) which inter-fits with a complimentary feature of the coil spacer 110 to locate and/or secure the coil spacer 110 to the inner shield 150. For example, the coil spacer 110 may have threads, ferrule, taper, or other structure suitable for attaching the coil spacer 110 to the inner shield 150.

The hub receptor 130 may serve as a backing or structural member for attaching the coil spacer 110 to the inner shield 150. Additionally, the hub receptor 130 or fastener 135 may interface with one of the plurality of hubs 165 of the coil 170. The hub receptor 130 may have receiving features 185 for forming a joint or connection with respective complimentary hub features 180 on the one of the plurality of hubs 165. In some embodiments, the hub features 180 and the receiving features 185 engage to form a structural connection between the one of the plurality of hubs 165 and the coil spacer 110 for supporting the coil 170. The receiving features 185 and the hub features 180 may be finger joints, tapered joint, or other suitable structure for forming a union between the plurality of hubs 165 and each of the coil spacers 110 suitable for supporting the coil 170. In some embodiments, the receiving features 185 may form part of an electrical connection.

One or more of the coil spacers 110 may have an electrical pathway (not shown in FIG. 1B) extending there through. The electrical pathway may be configured to provide an electrical connection between the plurality of hubs 165 on the coil 170 and the power source 151 for energizing the coil 170. Alternately, the coil spacers 110 may not provide an electrical pathway and the power for energizing the coil 170 is provided in another manner without passing through one of the coil spacers 110. The electrical pathway may be a conductive path for transmitting an electrical signal. Alternately, the electrical pathway may be a void or space which provides accessibility of electrical connections between the power source 151 and one or more of the plurality of hubs 165 of the coil 170.

The coil spacer 110 may be formed from a metal, such as stainless steel. In some embodiments, stainless steel powder having a size of 35-45 micrometers is a suitable precursor material as described further below. The coil spacer 110 may electrically isolate the coil 170 from the inner shield 150. The coil spacer 110 may have an opening 190. The opening 190 may be configured to accept one of the plurality of hubs 165. The opening 190 may be disposed in the top portion 140 and extend towards the bottom portion 145. In some embodiments, the opening 190 has a circular profile and is configured to accept one of the plurality of hubs 165 having a round shape. In another embodiment, the opening 190 is shaped to receive one of the plurality of hubs 165 having a complimentary inter-fitting shape.

In some embodiments, the coil spacer 110 includes a base plane 198 in alignment with an axis 197 and the bottom portion 145. The base plane 198 generally extends across bottom portion 145. FIG. 1B also shows the outer shield 195 adjacent the chamber component 100. While not connected with the chamber component 100, the outer shield 195 is shown aligned in parallel with the axis 197, the bottom portion 145, and the base plane 198.

In some embodiments, one or more of the coil spacer 110 or the coil 170 may have surfaces that are texturized to promote adhesion and minimize flaking of deposited material during operation of the process chamber 101. For example, although not visible in FIG. 1, the coil 170 may have an inner sidewall that is texturized.

Figure 2:
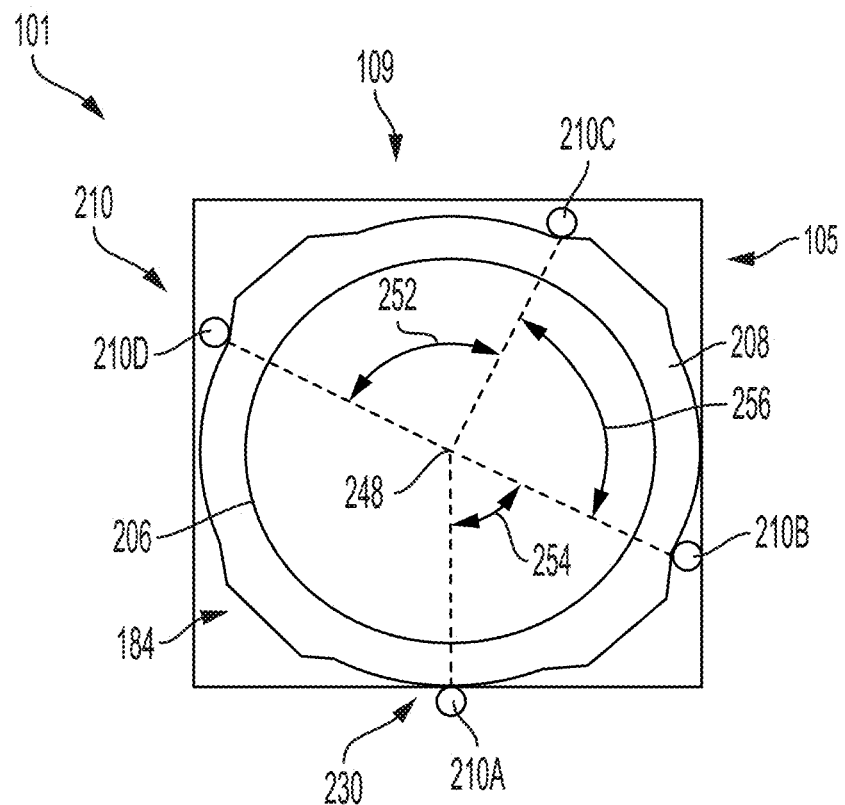
FIG. 2 is a top schematic view of a plurality of magnets placed about the chamber body in accordance with at least some embodiments of the present disclosure.

FIG. 2 is a top schematic view of a plurality of magnets 210 placed about the chamber body 105. In some embodiments, the external magnetic assembly 184 includes a housing 208. In some embodiments, the plurality of magnets 210 are coupled to the housing 208. In some embodiments, the housing 208 is disposed between the chamber body 105 and the lid 104. In some embodiments, the housing 208 is coupled atop the chamber body 105. The housing 208 includes a central opening 206.

The plurality of magnets 210 may be disposed at any suitable location, have any suitable polarity, and have any suitable strength. In some embodiments, the plurality of magnets 210 are permanent magnets. In some embodiments, the plurality of magnets 210 have a field strength of about 1500 to about 3000 gauss. In some embodiments, the plurality of magnets 210 have a diameter of about 0.3 to about 1.0 inches. The plurality of magnets 210 may be oriented in different directions, for example, north side up or south side up, as desired to facilitate a more uniform etch rate or deposition rate. In some embodiments, a coil RF side 230 of the process chamber 101 corresponding with a location of the power source 151 may be disposed opposite the substrate transfer port 109.

In some embodiments, the plurality of magnets 210 are arranged in a plurality of magnet sets. In some embodiments, each magnet of the plurality of magnets 210 are the same size and strength. In some embodiments, the magnets sets comprise a single magnet or multiple magnets stacked on top of each other. In some embodiments, as shown in FIG. 2, the plurality of magnets 210 are arranged in four magnet sets. In some embodiments, the plurality of magnets 210 are disposed in an asymmetrical arrangement about the housing 208. In some embodiments, some of the plurality of magnets 210 are oriented south side up and others of the plurality of magnets 210 are oriented north side up. In some embodiments, a first magnet set 210A of the plurality of magnets 210 may include a single magnet oriented south side up. The first magnet set 210A may be disposed on the coil RF side 230. In some embodiments, a second magnet set 210B of the plurality of magnets 210 may include one or more magnets, for example two magnets, stacked on top of each other so that the magnetic field strength of the second magnet set 210B is greater than the magnetic field strength of the first magnet set 210A. In some embodiments, the second magnet set 210B is oriented south side up. In some embodiments, a third magnet set 210C may include a single magnet oriented north side up. In some embodiments, a fourth magnet set 210D may include one or more magnets stacked on top of each other. In some embodiments, the fourth magnet set 210D may comprises two magnets oriented north side up.

In some embodiments, at least two magnet sets of the plurality of magnets 210 are disposed about 180 degrees from each other about a central axis 248 of the central opening 206. For example, the second magnet set 210B and the fourth magnet set 210D may be disposed about 180 degrees from each other about the central axis 248. In some embodiments, the first magnet set 210A and the second magnet set 210B are disposed at an angle 254 about a central axis 248 of the central opening 206. In some embodiments, the angle 254 is about 50 to about 75 degrees. In some embodiments, the second magnet set 210B and the third magnet set 210C are disposed at an angle 256 about the central axis 248. In some embodiments, the angle 256 is about 105 to about 125 degrees. In some embodiments, the third magnet set 210C and the fourth magnet set 210D are disposed at an angle 252 about the central axis 248. In some embodiments, the angle 252 is about 80 to about 100 degrees. In some embodiments, the third magnet set 210C is proximate the substrate transfer port 109.

Figure 3:
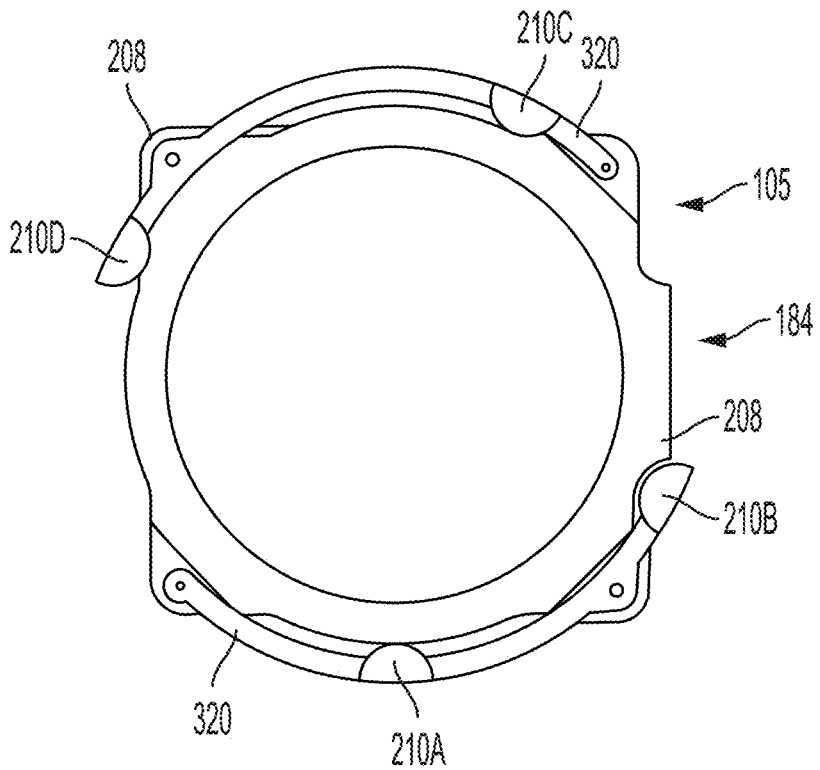
FIG. 3 is a top schematic view of a plurality of magnets placed about the chamber body in accordance with at least some embodiments of the present disclosure.

FIG. 3 is a top schematic view of the external magnetic assembly 184 in accordance with some embodiments of the present disclosure. In some embodiments, one or more base plates 320 are coupled to the housing 208, and the plurality of magnets 210 are coupled to the one or more base plates 320. The one or more base plates 320 may be arcuate shaped. For example, the one or more base plates 320 may comprise two base plates, each base plate coupled to a plurality of magnet sets of the plurality of magnets 210. For example, the first magnet set 210A and the second magnet set 210B may be coupled to a first of the one or more base plates 320, while the third magnet set 210C and the fourth magnet set 210D may be coupled to a second of the one or more base plates 320.

Figure 4:
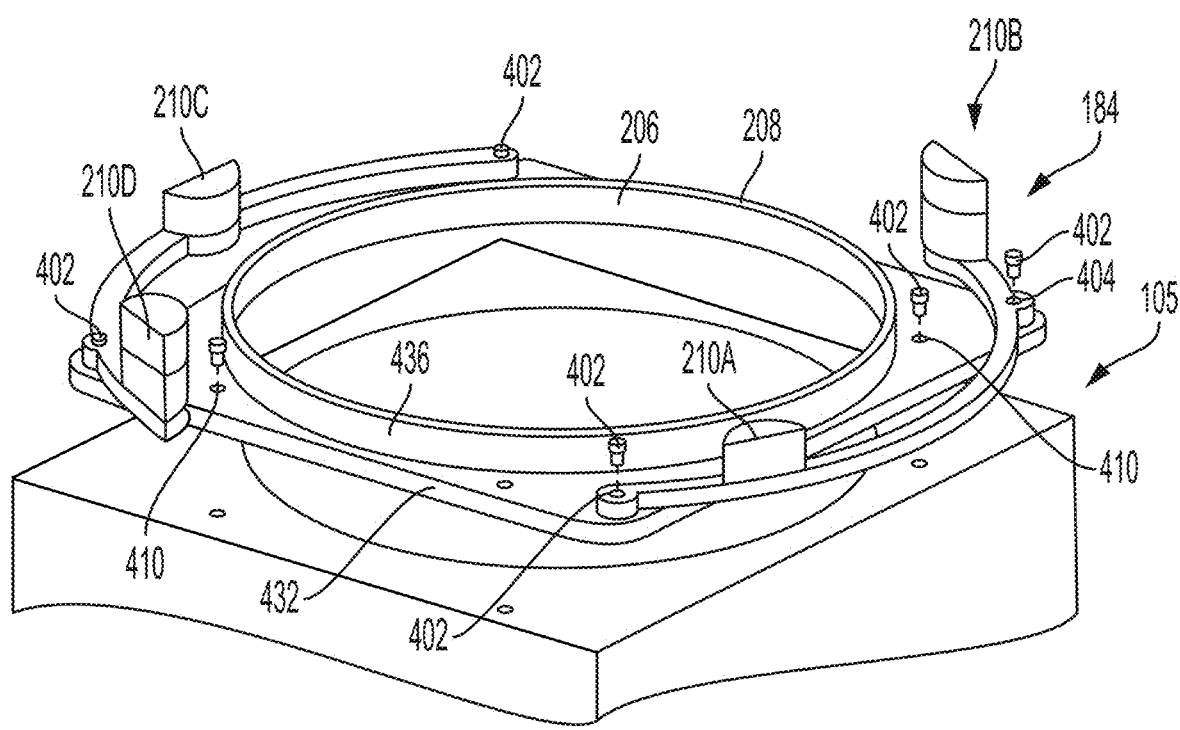
FIG. 4 is an isometric exploded view of a portion of a process chamber and an external magnetic assembly in accordance with at least some embodiments of the present disclosure.

FIG. 4 is an isometric exploded view of a portion of the process chamber and the external magnetic assembly 184. In some embodiments, the one or more base plates 320 are coupled to the housing 208 via fasteners 402 extending through openings 404 in the one or more base plates 320. In some embodiments, the external magnetic assembly 184 is coupled to the chamber body 105 via fasteners 412 extending through openings 410 in the housing 208. In some embodiments, the housing 208 includes a plate 432 and an inner lip 436 extending upward from the plate 432 to define the central opening 206.

Figure 5:
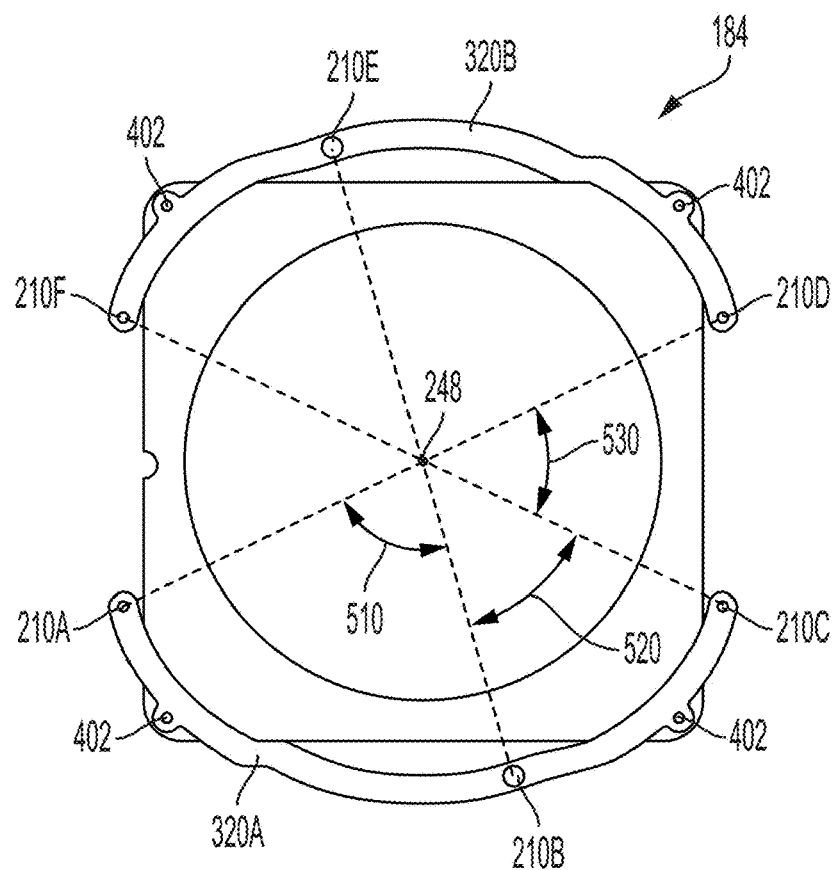
FIG. 5 is a top schematic view of a plurality of magnets placed about the chamber body in accordance with at least some embodiments of the present disclosure.
Figure 6:
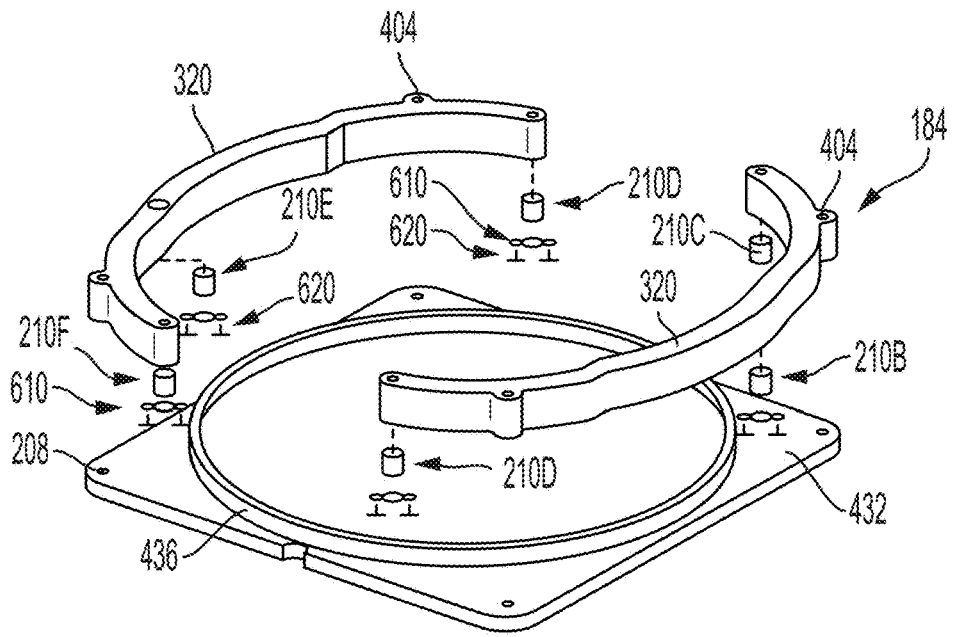
FIG. 6 is an isometric exploded view of a portion of an external magnetic assembly in accordance with at least some embodiments of the present disclosure.

FIG. 5 is a top schematic view of a plurality of magnets placed about the chamber body in accordance with at least some embodiments of the present disclosure. FIG. 6 is an isometric exploded view of a portion of an external magnetic assembly 184 in accordance with at least some embodiments of the present disclosure. In some embodiments, as shown in FIGS. 5 and 6, the plurality of magnets 210 are arranged in six magnet sets (210A through 210F). In some embodiments, the plurality of magnets 210 are disposed within or embedded in the one or more base plates 320. For example, the one or more base plates 320 may include openings to receive all or a portion of each of the plurality of magnets 210. In some embodiments, a fastener plate 610 may be coupled to the one or more base plates 320 via one or more fasteners 620 to retain each magnet of the plurality of magnets 210 in the respective openings of the one or more base plates 320.

In some embodiments, the first magnet set 210A, the second magnet set 210B, and the third magnet set 210C may be coupled to a first base 320A of the one or more base plates 320 with the second magnet set 210B disposed between the first magnet set 210A and the third magnet set 210C. In some embodiments, the fourth magnet set 210D, the fifth magnet set 210E, and the sixth magnet set 210F may be coupled to a second base 320B of the one or more base plates 320 with the fifth magnet set 210E disposed between the fourth magnet set 210D and the sixth magnet set 210F. In some embodiments, the first magnet set 210A, the fifth magnet set 210E, and the sixth magnet set 210F are oriented north side up. In some embodiments, the second magnet set 210G, the third magnet set 210C, and the fourth magnet set 210D are oriented north side down.

In some embodiments, each of the plurality of magnet sets are diametrically opposed to another set of the plurality of magnet sets. In some embodiments, the third magnet set 210C is closer to the second magnet set 210B than the first magnet set 210A. In some embodiments, the sixth magnet set 210F is closer to the fifth magnet set 210E than the fourth magnet set 210D. In some embodiments, the first magnet set 210A and the second magnet set 210B are disposed at an angle 510 from each other about the central axis 248. In some embodiments, the angle 510 is about 70 to about 90 degrees. In some embodiments, the second magnet set 210B and the third magnet set 210C are disposed at an angle 520 from each other about the central axis 248. In some embodiments, the angle 520 is about 40 to about 60 degrees. In some embodiments, the fourth magnet set 210D and the third magnet set 210C are disposed at an angle 530 from each other about the central axis 248. In some embodiments, the angle 530 is about 40 to about 60 degrees.

While the foregoing is directed to embodiments of the present disclosure, other and further embodiments of the disclosure may be devised without departing from the basic scope thereof.

The invention claimed is:

1. A process chamber, comprising:
a chamber body defining an interior volume therein;
a pedestal disposed in the interior volume for supporting a substrate;
a coil disposed in the interior volume above the pedestal; and
an external magnet assembly disposed above the coil, comprising:
a housing coupled atop the chamber body, wherein the housing includes a horizontal plate having a central opening and an inner lip extending upward from the central opening; and
a plurality of magnets disposed external to the chamber body, coupled to the horizontal plate, and arranged asymmetrically about the chamber body radially outward of the inner lip.

2. The process chamber of claim 1, further comprising one or more base plates coupled to the housing, wherein the plurality of magnets are coupled to the one or more base plates.

3. The process chamber of claim 2, wherein the one or more base plates are arcuate.

4. The process chamber of claim 2, wherein the plurality of magnets are disposed within or embedded in the one or more base plates.

5. The process chamber of claim 2, wherein the one or more base plates comprise two base plates with two or more magnets coupled to each of the two base plates.

6. The process chamber of claim 1, wherein the plurality of magnets are disposed radially outward of the housing.

7. The process chamber of claim 1, wherein the plurality of magnets are arranged in a plurality of magnet sets, wherein the plurality of magnet sets comprise four magnet sets or six magnet sets.

8. The process chamber of claim 1, wherein at least two magnets of the plurality of magnets are disposed about 180 degrees from each other about a central axis of a central opening of the housing.

9. The process chamber of claim 1, further comprising a target coupled to a lid of the process chamber, and wherein the external magnet assembly is disposed vertically between the coil and the target.

10. An external magnet assembly for use with a process chamber, comprising:
a housing having a plate with a central opening and an inner lip extending upward from the plate along the central opening;
a plurality of arcuate base plates coupled to the plate; and
a plurality of magnets coupled to each of the plurality of arcuate base plates, wherein the plurality of magnets are disposed radially outward of the inner lip.

11. The external magnet assembly of claim 10, wherein the plurality of magnets are disposed asymmetrically about the housing.

12. The external magnet assembly of claim 10, wherein the plurality of arcuate base plates extend about 120 to about 140 degrees about the central opening.

13. The external magnet assembly of claim 10, wherein the plurality of arcuate base plates comprise two base plates, wherein the plurality of magnets comprise six magnet sets, wherein a first magnet set, a second magnet set, and a third magnet set are coupled to a first base plate of the plurality of arcuate base plates, and wherein a fourth magnet set, a fifth magnet set, and a sixth magnet set are coupled to a second base plate of the plurality of arcuate base plates.

14. The external magnet assembly of claim 13, wherein the first magnet set, the fifth magnet set, and the sixth magnet set are oriented north side up, and the second magnet set, the third magnet set, and the fourth magnet set are oriented north side down.

15. The external magnet assembly of claim 10, wherein the plurality of magnet are arranged in magnet sets, and at least one of the magnets sets comprise multiple magnets stacked on top of each other.

16. A process chamber, comprising:
a chamber body coupled to a lid to define an interior volume therein;
a pedestal disposed in the interior volume for supporting a substrate;
a coil disposed in the interior volume above the pedestal; and
an external magnet assembly disposed above the coil, comprising:
a housing coupled atop the chamber body, wherein the housing includes a plate having a central opening and an inner lip extending upward from the central opening;
two arcuate base plates coupled to an upper surface of the housing; and
a plurality of magnets disposed external to the chamber body coupled to the housing via the two arcuate base plates and arranged asymmetrically about the chamber body, wherein the plurality of magnets are arranged in a plurality of magnet sets disposed radially outward of the inner lip.

17. The process chamber of claim 16, wherein the housing is disposed between the chamber body and the lid.

18. The process chamber of claim 16, wherein the coil is a single turn coil.

19. The process chamber of claim 16, wherein the plurality of magnets are permanent magnets.

20. The process chamber of claim 16, wherein at least one of the plurality of magnet sets is diametrically opposed to another set of the plurality of magnet sets.

* * * * *